(12) United States Patent
Ruckerbauer

(10) Patent No.: US 7,831,797 B2
(45) Date of Patent: *Nov. 9, 2010

(54) MEMORY SYSTEM AND METHOD FOR TRANSFERRING DATA THEREIN

(75) Inventor: Hermann Ruckerbauer, Moos (DE)

(73) Assignee: Qimonda AG, Munich (DE)

( * ) Notice: Subject to any disclaimer, the term of this patent is extended or adjusted under 35 U.S.C. 154(b) by 505 days.

This patent is subject to a terminal disclaimer.

(21) Appl. No.: 11/862,915

(22) Filed: Sep. 27, 2007

(65) Prior Publication Data

US 2008/0022037 A1 Jan. 24, 2008

Related U.S. Application Data

(63) Continuation of application No. 10/872,427, filed on Jun. 22, 2004, now Pat. No. 7,293,151.

(30) Foreign Application Priority Data

Jun. 24, 2003 (DE) ................ 103 28 385

(51) Int. Cl.
*G06F 12/00* (2006.01)

(52) U.S. Cl. ............ 711/173; 711/104; 711/105; 711/153; 711/172; 711/E12.046

(58) Field of Classification Search ............ None
See application file for complete search history.

(56) References Cited

U.S. PATENT DOCUMENTS

| 4,656,605 | A | 4/1987 | Clayton |
| 5,914,970 | A | 6/1999 | Gunsaulus et al. |
| 5,961,660 | A | 10/1999 | Capps, Jr. et al. |
| 6,070,262 | A | 5/2000 | Kellogg et al. |
| 6,185,718 | B1 | 2/2001 | Dell et al. |
| 6,826,113 | B2 | 11/2004 | Ellis et al. |

*Primary Examiner*—Reginald G. Bragdon
*Assistant Examiner*—Arvind Talukdar
(74) *Attorney, Agent, or Firm*—Slater & Matsil, L.L.P.

(57) ABSTRACT

A memory system is functionally designed so that, despite operation without an error correction device, memory chips of a memory module that are actually provided for error correction are concomitantly used for the data transfer. A control device is configured to receive, store and transfer data packets to and from a first and second set of memory chips. Transfer of an internal packet data from the control device to memory takes place such that a first record is stored in a second set of memory chips and additional records are stored in the first set of memory chips. In preferred embodiments, data is allocated in the second set of memory chips such that at least one additional transfer step takes place to the second set of memory chips compared with transfers to the first set of memory chips. In the additional transfer step(s), the first set of memory chips is masked from receiving data.

20 Claims, 4 Drawing Sheets

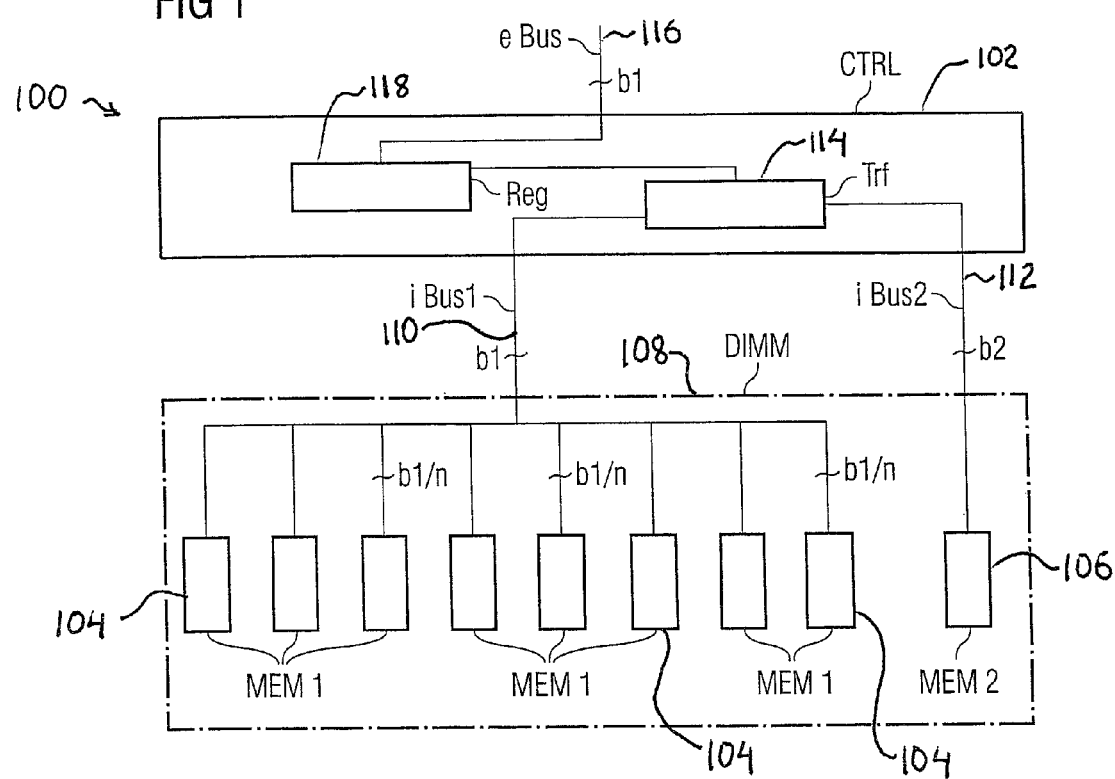

FIG 2A

| Bitnr.→ | 0-7 | 8-15 | 16-23 | 24-31 | 32-39 | 40-47 | 48-55 | 56-63 | |
|---|---|---|---|---|---|---|---|---|---|
| p 1: | aa | aa | aa | aa | aa | aa | aa | aa | ⎫ ~120 |
| ↓ 2: | bb | bb | bb | bb | bb | bb | bb | bb | ⎪ |
| 3: | cc | cc | cc | cc | cc | cc | cc | cc | ⎬ e Burst |
| 4: | dd | dd | dd | dd | dd | dd | dd | dd | ⎪ |
| 5: | ee | ee | ee | ee | ee | ee | ee | ee | ⎪ |
| 6: | ff | ff | ff | ff | ff | ff | ff | ff | ⎪ |
| 7: | gg | gg | gg | gg | gg | gg | gg | gg | ⎪ |
| 8: | hh | hh | hh | hh | hh | hh | hh | hh | ⎭ |

FIG 2B

| Bitnr.→ | 0-7 | 8-15 | 16-23 | 24-31 | 32-39 | 40-47 | 48-55 | 56-63 | 64-71 | |
|---|---|---|---|---|---|---|---|---|---|---|
| s 1: | bb | bb | bb | bb | bb | bb | bb | bb | aa | ⎫ ~122 |
| ↓ 2: | cc | cc | cc | cc | cc | cc | cc | cc | aa | ⎪ |
| 3: | dd | dd | dd | dd | dd | dd | dd | dd | aa | ⎬ i Burst |
| 4: | ee | ee | ee | ee | ee | ee | ee | ee | aa | ⎪ |
| 5: | ff | ff | ff | ff | ff | ff | ff | ff | aa | ⎪ |
| 6: | gg | gg | gg | gg | gg | gg | gg | gg | aa | ⎪ |
| 7: | hh | hh | hh | hh | hh | hh | hh | hh | aa | ⎪ |
| 8: | xx | xx | xx | xx | xx | xx | xx | xx | aa | ⎭ |
| | ↑ | ↑ | | | | ↑ | ↑ | ↑ | |
| | MEM1 | MEM1 ··· | | | | MEM1 | MEM1 | MEM2 | |

FIG 3A

| | Bitnr.→ | 0-7 | 8-15 | 16-23 | 24-31 | 32-39 | 40-47 | 48-55 | 56-63 |
|---|---|---|---|---|---|---|---|---|---|
| 124a e Burst | p ↓ 1: | aa | aa | aa | aa | aa | aa | aa | aa |
| | 2: | bb | bb | bb | bb | bb | bb | bb | bb |
| | 3: | cc | cc | cc | cc | cc | cc | cc | cc |
| | 4: | dd | dd | dd | dd | dd | dd | dd | dd |
| | 5: | ee | ee | ee | ee | ee | ee | ee | ee |
| | 6: | ff | ff | ff | ff | ff | ff | ff | ff |
| | 7: | gg | gg | gg | gg | gg | gg | gg | gg |
| | 8: | hh | hh | hh | hh | hh | hh | hh | hh |
| 124b e Burst | 1: | aa | aa | aa | aa | aa | aa | aa | aa |
| | 2: | bb | bb | bb | bb | bb | bb | bb | bb |
| | 3: | cc | cc | cc | cc | cc | cc | cc | cc |
| | 4: | dd | dd | dd | dd | dd | dd | dd | dd |
| | 5: | ee | ee | ee | ee | ee | ee | ee | ee |
| | 6: | ff | ff | ff | ff | ff | ff | ff | ff |
| | 7: | gg | gg | gg | gg | gg | gg | gg | gg |
| | 8: | hh | hh | hh | hh | hh | hh | hh | hh |

FIG 3B

| Bitnr.→ | 0-7 | 8-15 | 16-23 | 24-31 | 32-39 | 40-47 | 48-55 | 56-63 | 64-71 | |
|---|---|---|---|---|---|---|---|---|---|---|
| s 1: | bb | bb | bb | bb | bb | bb | bb | bb | aa | 1 s |
| 2: | cc | cc | cc | cc | cc | cc | cc | cc | aa | 2 |
| 3: | dd | dd | dd | dd | dd | dd | dd | dd | aa | 3 |
| 4: | ee | ee | ee | ee | ee | ee | ee | ee | aa | 4 |
| 5: | ff | ff | ff | ff | ff | ff | ff | ff | aa | 5 |
| 6: | gg | gg | gg | gg | gg | gg | gg | gg | aa | 6 |
| 7: | hh | hh | hh | hh | hh | hh | hh | hh | aa | 7 |
| 1: | bb | bb | bb | bb | bb | bb | bb | bb | aa | 8 |
| 2: | cc | cc | cc | cc | cc | cc | cc | cc | aa | 1 |
| 3: | dd | dd | dd | dd | dd | dd | dd | dd | aa | 2 |
| 4: | ee | ee | ee | ee | ee | ee | ee | ee | aa | 3 |
| 5: | ff | ff | ff | ff | ff | ff | ff | ff | aa | 4 |
| 6: | gg | gg | gg | gg | gg | gg | gg | gg | aa | 5 |
| 7: | hh | hh | hh | hh | hh | hh | hh | hh | aa | 6 |
| 8: | xx | xx | xx | xx | xx | xx | xx | xx | aa | 7 |
| | | | | | | | | | aa | 8 |

MEM1  MEM1  ···  MEM1  MEM1  MEM2

MEMORY SYSTEM AND METHOD FOR TRANSFERRING DATA THEREIN

This application is a continuation of patent application Ser. No. 10/872,427, entitled "Memory System and Method for Transferring Data Therein," filed on Jun. 22, 2004, now U.S. Pat. No. 7,293,151, which is incorporated herein by reference.

TECHNICAL FIELD

The present invention relates generally to memory devices and more particularly to a method for transferring data within DRAM devices.

BACKGROUND

Main memories of computer systems are generally formed using dynamic semiconductor memory chips (DRAM). For this purpose, a number of memory chips are combined on a small circuit board, a memory module. Such a memory module is often also referred to as a DIMM or SIMM memory. At least a portion of such memory modules then forms the main memory. The data traffic between the main memory and the processor device of the computer system is handled by means of a control device. The latter is arranged between one data bus, which connects it to the processor device, and a further data bus, which connects it to the main memory. In many computer systems, particularly relatively simple computer systems, both buses have the same data width. In this case, the number of memory chips to be selected for a data transfer operation is chosen such that their total number of data inputs and outputs is equal to the data width of the buses. By way of example, in the case of a simple desktop computer for so-called home use, the data width of the buses is nowadays usually equal to 64. If memory chips of so-called ".times.8" organization are used with a 64 bit wide data bus as main memory, 8 memory chips are provided for a single data transfer operation, since 8 memory chips having a data width of 8 bits per chip produce precisely 64 bits.

In the case of high-quality computer systems, such as network servers or workstations, the requirements made in respect of the memory chips being free of errors are often more stringent than in the case of the relatively simple computer systems described above. For this reason, such computer systems have so-called error correction devices which, upon storage of data in the main memory, generate one or more error correction bits (ECC bits or ECC information) per data record and transfer this information so that it is stored together with the data to be stored in the main memory. Correspondingly, when data stored in the main memory are read out, the associated ECC information is also concomitantly read out and transferred to the error correction device for corresponding evaluation and, insofar as is necessary and possible, error recovery (reconstruction of the original data). In this case, it is even possible to eliminate errors (in the sense of data reconstruction) which relate to the entire data width of one of the memory chips (so-called "chipkill"). The error correction device is generally part of the abovementioned control device.

Since this error detection and correction procedure is carried out chip by chip, two alternatives emerge for populating a memory module with memory chips: 1) either memory chips having a data width of 9 bits are used instead of memory chips having a data width of e.g. 8 bits (so-called .times.8 organization) (other examples: memory chips having .times.5 organization (=data width of 5 bits) instead of memory chips of .times.4 organization) or 2) use is made of customary memory chips (e.g. .times.8 or .times.4 organization) for storing the data and, additional memory chips having a data width which in total, i.e. including additional memory chips, have a combined data width that corresponds to the number of memory chips used for data storage.

However, the following disadvantages accrue to the abovementioned alternatives: in the case of alternative 1, it is necessary for a developer and manufacturer of memory chips to develop and manufacture two different chip variants for the same nominal storage capacity, namely, e.g., chips of .times.8 organization and chips of .times.9 organization. Correspondingly, a developer and manufacturer of the matching memory modules also has to develop and manufacture two circuit boards which are different from one another and are adapted to the respective memory chips.

In the case of the second alternative, although the developer and manufacturer of memory chips can restrict itself to a single type of memory chip (e.g. to those having a .times.8 organization), the developer and manufacturer of the memory modules nevertheless has to develop two different variants, namely a first variant, in which only memory chips for storing the memory data are used for placement, and a second variant involving additional placement also of at least one memory chip for storing the error correction data. In accordance with the two variants, different line routings are needed on the different memory modules, since the line routing has to be optimized separately for each variant in order to avoid losses in the signal quality.

It is thus apparent that a need exists to improve operation of memory chips and still provide for error correction.

SUMMARY OF THE INVENTION

In an embodiment of the present invention, a memory system comprises a control device in communication with a first and a second set of memory chips. The first set of memory chips are coupled to the control device through a first data bus having a predetermined data width. The second set of memory chips is coupled to the control device via a second internal bus having a predetermined data width. An external data bus is connected to the control device to receive external data in data packets, and output the data packets to the control device. The data packets are transferred from the control device to the first and second set of memory chips. A buffer storage device is contained within the control device for buffer storing at least one internal data packet. A transfer means located within the control device transfers from the control device a first portion of data of a respective internal data packet to the first set of memory chips and a remaining portion of data of the respective internal data packet to the second set of memory chips. The memory system is further configured to transfer data from a plurality of internal data packets from the control device, wherein a predetermined number of the plurality of internal data packets are transferred via both the first and second internal data buses, and a remainder of internal data packets of the plurality of internal data packets are transferred exclusively via the first internal data bus.

In another embodiment of the present invention, a method for transferring data in a memory system comprises storing an internal data packet that is to be transferred, in a buffer storage device. The internal data packet has a packet depth of a first predetermined number of data records, with at least one individual data record to be transferred, including a first data record. Transferring of data to be transferred is performed between a control device and a first set of memory chips. The data to be transferred to the first set of memory chips includes those of a second and additional data records in the internal data packet. Simultaneously to the step of transferring data to the first set of memory chips, a second predetermined number of the data that are buffer stored in the buffer storage device, are transferred between the control device and a second set of memory chips. The second predetermined number corresponds to a data width of an internal data bus coupled to the second set of memory chips. In a subsequent step, the data from the internal data packet that was not yet transferred after the completion of the above steps, are transferred to the second set of memory chips. Preferably, for additional internal data packets, the above sequence of steps is repeated until data of the respective at least one individual data record, in particular data of the respective first data record, have been transferred into all the memory cells of the second memory chips.

In another embodiment of the present invention, a method for transferring data in a memory system, comprises transferring and storing an internal data packet in a buffer storage device. Preferably, the internal data packet has a packet depth of a predetermined number of data records. The data is transferred over a first internal data bus from a first set of memory chips, wherein the transferred data is from all the data records with the exception of at least one individual data record, in particular, the data of a first data record. At the same time, a predetermined number of data of the at least one individual data record is transferred and stored in the buffer storage device. The predetermined number corresponds to a width of a second internal data bus that is configured to transfer the data of the first data record to the storage device. Upon the completion of the above steps, data of the at least one individual data record that has not yet been transferred is transferred and stored in the buffer storage device.

BRIEF DESCRIPTION OF THE DRAWINGS

FIG. 1 depicts a block diagram of the memory system according to an embodiment of the present invention.

FIG. 2a illustrates a first stage in the sequence of the operating methods according to an embodiment of the present invention.

FIG. 2b illustrates a further stage in the sequence of the operating methods according to the embodiment of FIG. 2a.

FIG. 3a illustrates a stage in the sequence of the operating methods according to another embodiment of the present invention.

FIG. 3b illustrates a further stage in the sequence of the operating methods according to the embodiment of FIG. 3a.

DETAILED DESCRIPTION OF ILLUSTRATIVE EMBODIMENTS

The following list of reference symbols is used consistently in the discussion to follow.

LIST OF REFERENCE SYMBOLS

| eBurst, iBurst | External, internal data packets |
| --- | --- |
| | External data bus |
| iBus1, iBus2 | Internal data buses |
| DIMM | Memory module |
| CTRL | Control device |
| Reg | Buffer storage device |

-continued

| Trf | Transfer means |
| --- | --- |
| b1, b2 | First, second data width |
| n, m | Number of memory chips |
| MEM1, MEM2 | 1st, 2nd memory chips |
| p | Number of data records |
| s | Transfer step |

FIG. 1 shows a block diagram of a memory system 100 according to an embodiment of the present invention, namely a control device 102 (CTRL), n=8 first set of memory chips 104 (MEM1) and one (m=1) second set of memory chips 106 (MEM2) (in this example the second set has only one memory chip, but will also be referred to hereinafter as "second set of memory chips"). The memory chips 104, 106 are part of a memory module 108 (DIMM). The first set of memory chips 104 are connected via a first internal data bus 110 (iBus1) to the control device 102, specifically to a transfer means 114 (Trf). The first internal data bus 110 has a first data width b1, which is assumed to be 64 bits (=8 bytes). The second memory chip 106 is connected via a second internal data bus 112 (iBus2) to the control device 102, specifically to the transfer means 114. The second internal data bus 112 has a second data width b2, which is assumed to be 8 bits (=1 byte), which corresponds to the number n of first memory chips 104. The memory system is furthermore designed, in a known manner, such that data are transferred between the control device 102 and the memory chips 104, 106 by means of internal data packets iBurst (not shown). Such an internal data packet iBurst, which is often also referred to as a burst, comprises a sequence of p data records (p=8 data records are assumed in the present case), each of which has a width corresponding to the sum of the two data widths b1, b2. Thus, a data record width of 72 bits is assumed in the present case. Control devices such as 102 always have a so-called masking function that can exclude individual memory chips 104, 106 connected to control device 102, data record by data record, from a data transfer with associated memory operation (writing data to a memory chip and/or reading data from a data chip). The consequence of utilizing this masking function, is that, in the event of a data transfer, it is possible to transfer data records having effectively fewer bits than the abovementioned data record width (72 bits in the present case). This property is utilized in embodiments of the present invention, as explained below.

As depicted in FIG. 1, control device 102 can be connected to an external data bus 116 (eBus), to the other end of which a processor, for example, can be connected. Via said external data bus 116, the control device 102 receives the data which are to be transferred to the first memory chips 104 and, according to the invention, to the second memory chips 106. Furthermore, the control device 102 outputs to the external data bus 116 data transferred from the first memory chips 104 and, according to the invention, from the second memory chip 106. In the present example, in an exemplary embodiment of the present invention, the external data bus 116 has the same data width as the first internal data bus 110 even though, when considered from a purely technical standpoint, it could also have a different data width (as may be the case in conventional memory systems). The transfer of the data via the external data bus 116 is also accomplished by means of data packets, namely external data packets 120 (eBurst), which are in turn constructed from data records, for example p=8.

The control device 102 additionally contains, in a known manner, a buffer storage device Reg (118), e.g. one or more registers, for buffer storing at least one internal data packet 122 (iBurst), if appropriate and in a preferred embodiment, additionally at least one external data packet 120. Using the transfer means 114, it is possible to transfer some of the data of a respective internal data packet 122 between control device 102 and first set of memory chips 104. The remaining data of such an internal data packet 122 can likewise be transferred between control device 102 and second set of memory chips 106.

According to an exemplary embodiment of the present invention, memory system 100 is further designed so that, in the case of an initial number of internal data packets 122, the data to be transferred between the control device 102 and the memory chips 104, 106, for each internal data packet 122, are transferred via both internal data buses 110, 112, the data to be transferred, in each internal data packet 122, being identical to the data of a corresponding external data packet 120. In the case of further internal data packets beyond the initial data packets 122, preferably, the data transfer is carried out exclusively via the first internal data bus 110.

In other embodiments of the present invention, the memory chips 104, 106 form a memory module 108. In this case, it is also expedient for the control device 102 to be part of the memory module 108.

Aspects of the present invention will be explained in greater detail with reference to FIGS. 2a, 2b, 3a, 3b. FIG. 2a illustrates examples of a method for transferring data according to an exemplary embodiment of the present invention, which relates to transfer of a series of external data packets 120, present at control device 102, to memory chips 104, 106. For this purpose, FIG. 2A shows an individual external data packet 120, assumed to be a first data packet. Each external data packet 120 is assumed to contain p (=8 here in the present case) data records each of 64 bits of the first data width b1. In FIG. 2A (and subsequent Figures) each of the data records is represented by a row containing a sequence of mutually identical letters (e.g. "aa aa aa . . . "). Each of these letters symbolically represents 4 bits, so that 16 letters illustrated result in a first data width b1 of 64 bits (=8 bytes). The entire external data packet 120 comprises p=8 (1 . . . 8, far left column in FIG. 2A) data records, each of these having data width b1=64 bits.

This external data packet 120, when located in whole or in part in register 118, is then handled by control device 102, as an internal data packet 122 to be transferred to the memory chips 104, 106. In accordance with an embodiment of the present invention: firstly, the data from an individual data record or a plurality of individual data records, are buffer stored in buffer storage device 118. In this exemplary embodiment of the present invention, it is assumed that the data of the first data record (which are indeed designated by "aa . . . aa"; p=1) are buffer stored in buffer storage device 118.

Subsequently, the data of a second data record (these are designated by "bb . . . bb"; p=2) are transferred into the first memory chips 104 via the first internal data bus 110 in a first transfer step s=1 and are stored there as first stored data record (s=1 in FIG. 2B). At the same time, a predetermined number of data ("aa") of the individual data record originally buffer stored in the buffer storage device 118 (which data record is indeed the first data record in the present example), said number corresponding to the second data width b2 of the second memory chip 106 (this second data width b2 is assumed to be 8 bits), are transferred via second internal data bus 112, to second memory chip 106. Thus, as illustrated in row S1 of FIG. 2b, in total, 72 bits, rather than 64 bits, are transferred per transfer step in the case of the transfer operation.

The data of the third data record ("cc . . . cc"; p=3) are then transferred to first set of memory chips 104 as indicated in FIG. 2b (second transfer step: s=2), at the same time the next 8 bits (corresponding to the second data width b2) of the first data record buffer (aa) stored in buffer storage device 118 are transferred to second set of memory chip 106. This sequence is correspondingly carried out with the remaining data records of the internal data packet (equivalent to eBurst 120) to be transferred until the originally eighth (and thus the last) data record ("hh . . . hh"; p=8) of data packet 120 has also been transferred.

However, since this only entails 7 transfer operationss in total, a last 8 bits of data packet 120, that had been buffer stored in buffer storage device 118, have not yet been transferred. These bits are now transferred into second set of memory chip 106 via the second internal data bus 112 (transfer step s=8 in FIG. 2B), using a known masking function of control device 102. During this transfer step, all of first set of memory chips 104 are masked, so that no data are transferred between control device 102 and first set of memory chips 104. This is indicated in FIG. 2B by "xx . . . xx" in the sense of the generally known meaning of "don't care". The number of these transfer steps which are required for transfer with masking of the first memory chips 104 can be calculated according to the following formula: s=b1/p/b2.

The data transfer of further internal data packets 122 is carried out in a similar fashion. However, one feature of the latter process should be particularly noted: it is the case that, for each internal data packet 122, effectively, including the masking step, fewer transfer steps occur with regard to first set of memory chips 104 compared to second set of memory chips 106. In the above example, there are seven effective steps for first memory chips 104 and eight steps for second memory chip 106. With regard to the transfer of the further internal data packets 122, this results in an increasing offset of addressing values between e first set of memory chips 104, on the one hand, and second set of memory chips 106 on the other hand. This offset can be calculated as follows for the exemplary embodiment of the present invention described above: offset=current number of a internal data packet that is presently to be transferred−1. It is assumed for this formula that the current numbers of internal data packets to be transferred are calculated from 1. However, if they are counted from as low as the value "0" (which is generally customary in data processing), then the correction term "−1" in the formula presented above is omitted.

FIG. 3A shows an exemplary embodiment of the present invention where a plurality of internal data packets 122 to be transferred. Two external data packets 124a which are present in control device 102 and are intended to be transferred from the latter and stored as internal data packets 124b in memory chips 104, 106 (see FIG. 3b) using internal data buses 110, 112. The process in this embodiment, illustrated in FIG. 3B, proceeds in exactly the same way as described above with reference to FIG. 2B.

With regard to the first of internal data packets 124a, the data of a first data record (p=1) are buffer stored in the buffer storage device 118. Afterward, the data of additional data records (p=2 . . . 8) of the first internal data packet 124a are transferred into first set of memory chips 104 via first internal data bus 110 (s=1 . . . 7), while data of the first, buffer stored data record are at the same time in each case transferred into second set of memory chips 106. When the data of all the data records except for those of the first data record (p=1) have then been transferred, the remaining data, not yet transferred, of the first data record (p=1) buffer stored in buffer storage device 118, are transferred into second set of memory chips

106 via second internal data bus 112, while first set of memory chips 104 are masked.

The same sequence of data transfer steps takes place with the data of the data records of second of the internal data packets 126 located at the lower half of FIG. 3a. In this case, an address offset as described above is established, which is illustrated by means of dotted lines in FIG. 3B in the case of the far right chip of first set of memory chips 104, and in the case of second set of memory chips 106. In order to be able to better illustrate this offset, the left-hand edge of FIG. 3B illustrates the numbering of those transfer steps (s=1 . . . 7) that take place without masking, that is to say effectively, with regard to first internal data bus 110 (and thus with regard to the first memory chips 104). Correspondingly, the right-hand edge of FIG. 3B illustrates the numbering of those transfer steps (s=1 . . . 8) which take place, including masking, with regard to second internal data bus 112 (and thus with regard to the second memory chip 106). It is to be noted that first set of memory chips 104 are masked from control device 102 during the respective last transfer step of data packet 126 (s=8), so that no data are transferred via first internal data bus 110 in these cases. The offset increases when further internal data packets 126 are transferred, as already described, so that at some point all the memory cells of second set of memory chips 106 have been filled with transfer data, while first set of memory chips 104 still contain memory cells into which no data have yet been transferred. In the case of the dimensioning of the data width b1, b2 that is chosen here, this is the case when data have been transferred into ⅞ of the memory cells of the first memory chips 104. Once this has been reached, further internal data packets 126 to be transferred, as is known in the prior art, can be transferred with all their data records exclusively via the first internal data bus 110 to first memory chips 104.

In a further embodiment of the present invention, a method for transferring data in memory system 100 is implemented for reading out data stored in memory chips 104, 106. In the case of an internal data packet (not shown) to be transferred having a packet depth of, e.g., p=8 data records, data of all data records with the exception of a first data record are transferred from first set of memory chips 104 into control device 102, and are buffer stored therein in buffer storage device 118. At the same time as the transfer of each of these data records, a predetermined number of data of the (assumed by way of example to be the) first data record, said number corresponding to the data width b2 of second internal data bus 112, are transferred from a chip in second set of memory chips 106 into control device 102 and are buffer stored in the buffer storage device 118. After the last of data records from first set of memory chips 104 has been transferred, remaining data of the first data record that have not yet been transferred are transferred from second set of memory chips 106 into control device 102 and are buffer stored therein in buffer storage device 118. During the latter step, concomitant masking of first set of chips 104 prevents transfer of data therefrom. Consequently, all data of all data records of an internal data packet are present in buffer storage device 118 and can be transferred to external data bus 116 in a conventional manner.

Thus, the present invention provides a memory system having at least one memory module in which it is possible, when considered from the number of memory chips and the total data width thereof, to use a single type of memory module which is suitable both for operation with an error correction device and for operation without such an error correction device. It is furthermore possible to specify an operating method for operation without an error correction device.

It is an advantage of the present invention, illustrated in FIGS. 2a, 2b, 3a, 3b using memory systems having a bus width of 64 bits and memory chips having a data width of 8 bits, that a manufacturer of memory modules no longer has to provide different variants of population with memory chips with all the disadvantages described in the introduction. Rather, the manufacturer only has to provide a single variant, which, depending on the control device used, is optimally suitable both for use with an error correction device and for use without an error correction device. As is known, the error correction data are generated and processed in a control device. If a manufacturer of a computer system, for example, wishes to provide a memory system having an error correction device in a computer of a computer system, the manufacturer, can buy in a customary fashion a control device suitable for error correction with memory chips of a memory module which, for example, has 9 memory chips having a respective data width of 8 bits. Eight of the memory chips whose total width is 64 bits are used for storing data, while the ninth of the memory chips is used for storing the error correction data.

However, if the computer manufacturer wishes to provide a memory of the present invention for this purpose, and can adopt the above-mentioned memory module for this purpose without changes in memory chips, because the necessary modifications are implemented exclusively in the control device. A customer and user of a computer system containing the memory system configured according to the embodiment of the present invention illustrated in FIG. 1, has the advantage that the available total storage capacity is greater (in the example: ⅛ greater) than in a conventional memory system containing memory chips that have the same individual storage capacity without an error correction device. Furthermore, the reduction to a single type of memory module with regard to the number of memory chips also affords advantages in respect of costs.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method of storing a data packet in a memory system, the method comprising:
    a) receiving the data packet from an external data bus, the data packet comprising a first data record and additional data records;

b) after the receiving the first data record, storing the first data record in a buffer storage device;

c) after the storing the first data record, storing a next one of the additional data records apportioned across a first set of memory chips and storing a next portion of the first data record, from the buffer storage device, in a second memory chip;

d) repeating step c) until a last one of the additional data records of the data packet has been stored in the first set of memory chips; and e) after the last one of the additional data records has been stored, storing a final portion of the first data record, from the buffer storage device, in the second memory chip.

2. The method of claim 1, wherein the storing of the next one of the additional data records and the storing of the next portion of the first data record are performed concurrently.

3. The method of claim 1, further comprising, during the storing of the final portion of the first data record, masking the first set of memory chips so that no data is written to the first set of memory chips.

4. The method of claim 1, wherein the first set of memory chips and the second memory chip are located on a same memory module.

5. The method of claim 1, wherein the next one of the additional data records is stored in the buffer storage device before being stored in the first set of memory chips.

6. The method of claim 1, wherein the second memory chip has a data bus width equal to a total number of memory chips in the first set of memory chips.

7. The method of claim 1, wherein the memory chips in the first set of memory chips and the second memory chip are a same type of memory chip.

8. The method of claim 1, wherein the next one of the additional data records and the next portion of the first data record are stored at a same address value in the first set of memory chips and the second memory chip, respectively.

9. The method of claim 1, wherein the next one of the additional data records and the next portion of the first data record are stored at offset address values in the first set of memory chips and the second memory chip, respectively.

10. The method of claim 9, wherein the offset address values are offset by a value that is one less than a total number of data packets stored in the first set of memory chips.

11. A method of transferring a data packet in a memory system, the data packet comprising a first data record and additional data records, the method comprising:

a) retrieving a next one of the additional data records from a first set of memory chips and retrieving a next portion of the first data record from a second memory chip;

b) after the retrieving the next one of the additional data records and the next portion of the first data record, storing the next one of the additional data records and the next portion of the first data record in a buffer storage device;

c) repeating steps a) and b) until a last one of the additional data records of the data packet has been retrieved and stored in the buffer storage device; and d) after the last one of the additional data records has been retrieved and stored, storing a final portion of the first data record, from the second memory chip, in the buffer storage device; and e) transferring the data packet onto an external data bus.

12. The method of claim 11, wherein the retrieving of the next one of the additional data records and the retrieving of the next portion of the first data record are performed concurrently.

13. The method of claim 11, further comprising, during the retrieving of the final portion of the first data record, masking the first set of memory chips so that no data is retrieved from the first set of memory chips.

14. The method of claim 11, wherein the first set of memory chips and the second memory chip are located on a same memory module.

15. The method of claim 11, wherein the data packet has a packet depth of eight data records, the first set of memory chips has a first data width of 64 bits, and the second memory chip has a second data width of eight bits.

16. The method of claim 11, wherein the second memory chip has a data bus width equal to a total number of memory chips in the first set of memory chips.

17. The method of claim 11, wherein the memory chips in the first set of memory chips and the second memory chip are a same type of memory chip.

18. The method of claim 11, wherein the next one of the additional data records and the next portion of the first data record are retrieved from a same address value in the first set of memory chips and the second memory chip, respectively.

19. The method of claim 11, wherein the next one of the additional data records and the next portion of the first data record are retrieved from offset address values in the first set of memory chips and the second memory chip, respectively.

20. The method of claim 19, wherein the offset address values are offset by a value that is one less than a total number of data packets stored in the first set of memory chips.

* * * * *